(12) United States Patent
Ju et al.

(10) Patent No.: US 7,504,888 B1
(45) Date of Patent: Mar. 17, 2009

(54) INTERNALLY COMPENSATED DIFFERENTIAL AMPLIFIER

(75) Inventors: Shu-Ing Ju, Palo Alto, CA (US); Jayendar Rajagopalan, Newcastle, WA (US); Jeffry Mark Huard, Puyallup, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 7 days.

(21) Appl. No.: 11/862,006

(22) Filed: Sep. 26, 2007

(51) Int. Cl.
*H03F 3/04* (2006.01)
(52) U.S. Cl. .................. 330/301; 330/302; 330/278
(58) Field of Classification Search ............. 330/301, 330/302, 278
See application file for complete search history.

(56) References Cited

U.S. PATENT DOCUMENTS

| | | | | |
|---|---|---|---|---|
| 3,660,773 A * | 5/1972 | Free | ............................ | 330/256 |
| 4,908,566 A | 3/1990 | Tesch | | |
| 4,933,826 A | 6/1990 | Person | | |
| RE35,261 E * | 6/1996 | Nelson | ........................ | 330/257 |
| 5,889,393 A | 3/1999 | Wrathall | | |
| 6,340,918 B2 * | 1/2002 | Taylor | ........................ | 330/292 |
| 6,396,716 B1 | 5/2002 | Liu et al. | | |
| 6,566,949 B1 * | 5/2003 | Park | ............................ | 330/252 |
| 6,774,722 B2 * | 8/2004 | Hogervorst | .................. | 330/258 |
| 7,248,117 B1 * | 7/2007 | Li et al. | ........................ | 330/260 |

OTHER PUBLICATIONS

Jeongjin, R., High-Performance Error Amplifier for Fast Transient DC-DC Converters, IEEE Transactions on Circuits and Systems—II: Express Briefs, Sep. 2005, pp. 591-595, vol. 52, No. 9, Hanyang University, Ansan, Korea.
Huang, H. et al., On-Chip Compensated Error Amplifier for Fast Transient DC-DC Converters, Electro/Information Technology, 2006 IEEE International Conference, May 2006, pp. 103-108, Taiwan.
Abou-Alfotouh, A. et al., Compensation Circuit Design Considerations for High Frequency DC/DC Buck Converters with Ceramic Output Capacitors, Applied Power Electronics Conference, APEC 2007, Twenty Second Annual IEEE, Feb. 2007, pp. 736-742.
Sakurai, H. et al., Design of a Current-mode, MOS, DC-DC Buck Converter with a Quadratic Slope Compensation Scheme, Circuits and Systems, 48th Midwest Symposium, Aug. 7-10, 2005, pp. 671-674, vol. 1.
Chang, C. et al., Bidirectional Current-Mode Capacitor Multiplier in DC-DC Converter Compensation, System-on-Chip for Real-Time Applications, Fifth International Workshop, Jul. 20-24, 2005, pp. 111-116, Department of Electrical and Control Engineering National Chiao-Tung University, Hsinchu, Taiwan.

* cited by examiner

*Primary Examiner*—Patricia Nguyen
(74) *Attorney, Agent, or Firm*—Darby & Darby P.C.; Matthew M. Gaffney

(57) ABSTRACT

The invention relates to a differential amplifier with internal compensation. The invention also relates to a regulator controller and a regulator which includes such an amplifier. The amplifier includes a preamplifier circuit and a gain circuit. The frequency response of the amplifier is based in part on internal compensation within the preamplifier circuit. The internal compensation of the differential amplifier includes a low frequency zero that is provided by the preamplifier circuit.

20 Claims, 7 Drawing Sheets

US 7,504,888 B1

INTERNALLY COMPENSATED DIFFERENTIAL AMPLIFIER

TECHNICAL FIELD

The invention is generally directed to the area of differential amplifiers. The invention is directed, particularly, but not exclusively to an internally compensated differential amplifier.

BACKGROUND

Differential amplifiers, such as operational amplifiers, error amplifiers, and/or the like, exhibit certain frequency response characteristics. For example, when input signals of differing frequencies and magnitudes are applied to the inputs of a non-ideal differential amplifier, the output phase and gain may vary. When designing circuits employing differential amplifiers, the frequency response characteristics of the amplifiers are often considered.

Differential amplifiers are often employed as error amplifiers in the feedback loop of switching regulators. Switching regulators also exhibit additional frequency response characteristics. These frequency response characteristics are typically based in part on the load and regulator inductance, capacitance, and resistance. Thus, the frequency response characteristics of a switching regulator are based on the characteristics of the error amplifier, load and converter inductance, capacitance, and resistance, and/or the like.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified. These drawings are not necessarily drawn to scale.

For a better understanding of the present invention, reference will be made to the following Detailed Description, which is to be read in association with the accompanying drawings, wherein.

DETAILED DESCRIPTION

Various embodiments of the present invention will be described in detail with reference to the drawings. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference. References in the singular are made merely for clarity of reading and include plural reference unless plural reference is specifically excluded. The meaning of either "in" or "on" includes both "in" and "on." The term "or" is an inclusive "or" operator, and is equivalent to the term "and/or" unless specifically indicated otherwise. The term "based on" or "based upon" is not exclusive and is equivalent to the term "based, at least in part, on" and includes being based on additional factors, some of which are not described herein. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function or functions. The term "signal" means at least one current, voltage, charge, temperature, data, or other signal. A "signal" may be used to communicate using active high, active low, time multiplexed, synchronous, asynchronous, differential, single-ended, or any other digital or analog signaling or modulation techniques. Where either a field effect transistor (FET) or a bipolar transistor may be employed as an embodiment of a transistor, the scope of the words "gate", "drain", and "source" includes "base", "collector", and "emitter", respectively, and vice versa. The phrase "in one embodiment," as used herein does not necessarily refer to the same embodiment, although it may.

Briefly stated, the invention is relates to a differential amplifier with internal compensation. The invention also relates to a regulator controller and a regulator which includes such an amplifier. The amplifier includes a preamplifier circuit and a gain circuit. The frequency response of the amplifier is based in part on internal compensation within the preamplifier circuit. The internal compensation of the differential amplifier includes a low frequency zero that is provided by the preamplifier circuit.

Figure 1:
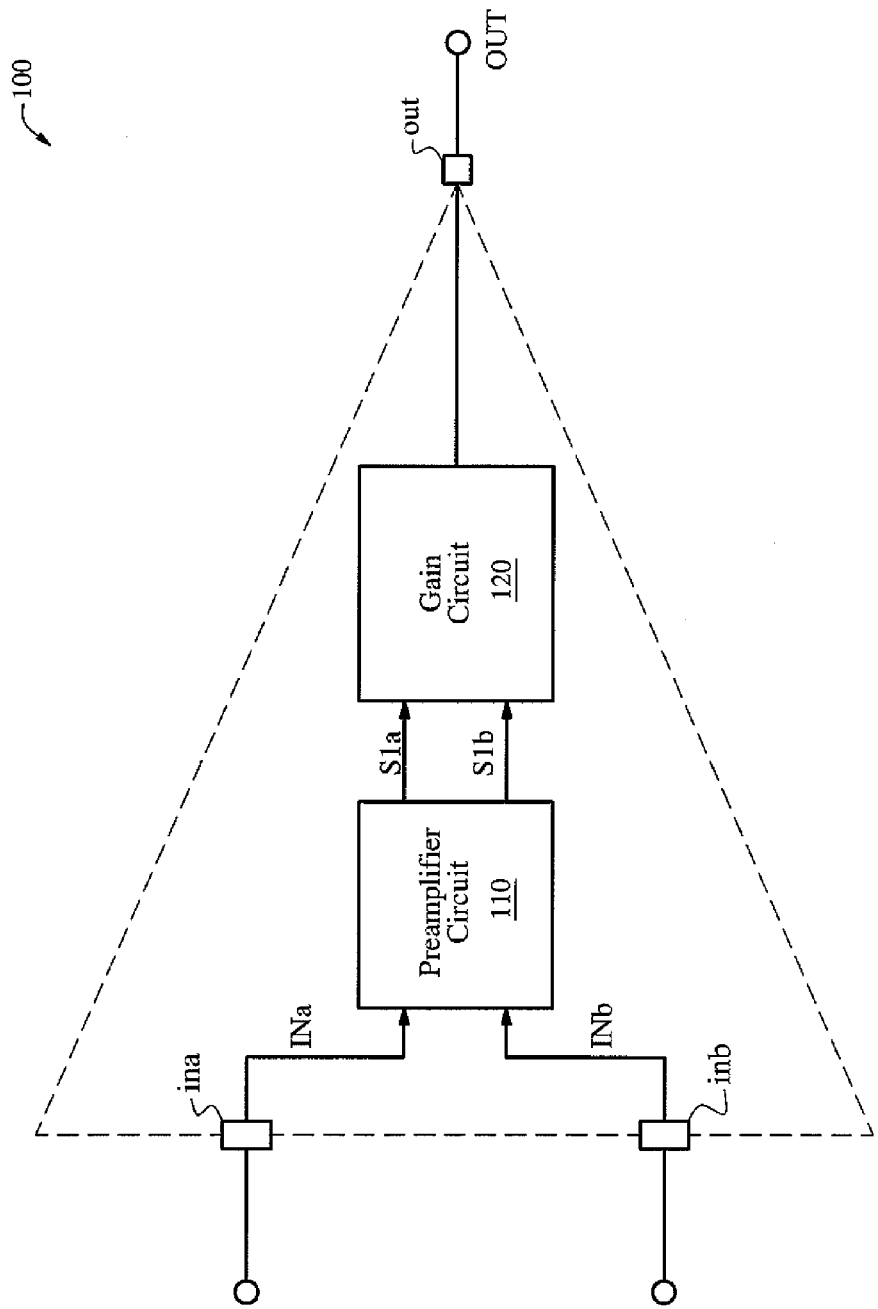
FIG. 1 is a block diagram of an embodiment of a circuit according to aspects of the present invention.

FIG. 1 is a block diagram of an embodiment of differential amplifier 100. Differential amplifier 100 includes preamplifier circuit 110 and gain circuit 120.

Differential amplifier 100 is arranged to receive signal INa at input in a and signal INb at input inb. Differential amplifier 100 is further arranged to provide output signal OUT at output out based, at least in part, on a difference between signals INa and INb. Signals INa and INb may comprise a differential signal pair, may be two sets of differential signal pairs, may be unrelated single-ended signals, and/or the like.

Preamplifier circuit 110 is arranged to receive signals INa and INb and to provide signals S1a and S1b based, at least in part, on a difference between signals INa and INb. In one embodiment, signals S1a and S1b are a differential signal pair. In addition, as discussed below for one embodiment, preamplifier circuit 110 provides a zero. In one embodiment, this zero compensates for an external complex pole of a voltage mode regulator. In addition, this zero improves the stability of differential amplifier 100. Preamplifier circuit 110 may provide either unity gain, signal attenuation, or signal amplification.

Gain circuit 120 is arranged to receive signals S1a and S1b and to provide single-ended output signal OUT at differential amplifier 100 output out based, at least in part, on a difference between signals S1a and S1b. Gain circuit 120 is also arranged to multiply the difference between signals S1a and S1b with a gain factor. This gain factor may be any value that is suitable for a given implementation of differential amplifier 100. In addition, gain circuit 120 may be further arranged to provide another zero. The frequency at which this additional zero is provided is discussed below for one embodiment.

Figure 2:
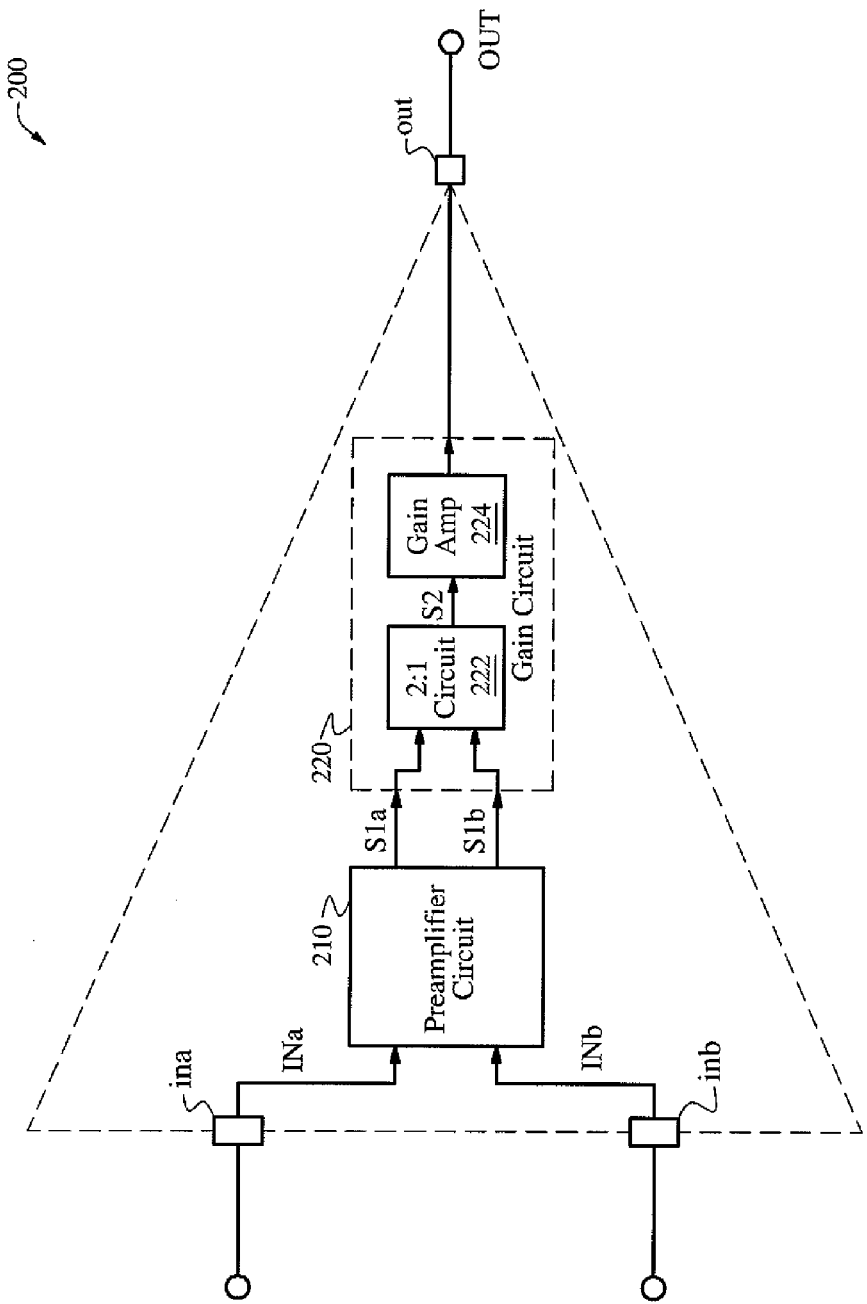
FIG. 2 is another block diagram of an embodiment of another circuit according to aspects of the present invention.

FIG. 2 is a block diagram of an embodiment of differential amplifier 200. Differential amplifier 200 may be employed as an embodiment of differential amplifier 100 of FIG. 1. As illustrated, differential amplifier 200 includes preamplifier circuit 210 and gain circuit 220. Gain circuit 220 includes differential-to-single-ended converter 222 and gain amplifier 224.

Differential-to-single-ended converter 222 is arranged to receive signals S1a and S1b and to provide single-ended signal S2 based, at least in part, on the difference between signals S1a and S1b. Any suitable topology for differential-to-single-ended converter 222 may be employed. Further, differential-to-single-ended converter 222 may provide unity gain, signal amplification, or signal attenuation. Likewise, differential-to-single-ended converter 222 may be arranged to provide signal S2 as either a current signal or as a voltage signal.

Gain amplifier 224 is arranged to receive signal S2 and to provide output signal OUT at differential amplifier 200 output out based, at least in part, on the value of signal S2. Gain circuit 220 is also arranged to multiply the value of signal S2 with a gain factor. This gain factor may be any value that is suitable for a given implementation. Gain amplifier may employ feedback or may operate as an open-loop amplifier.

Figure 3:
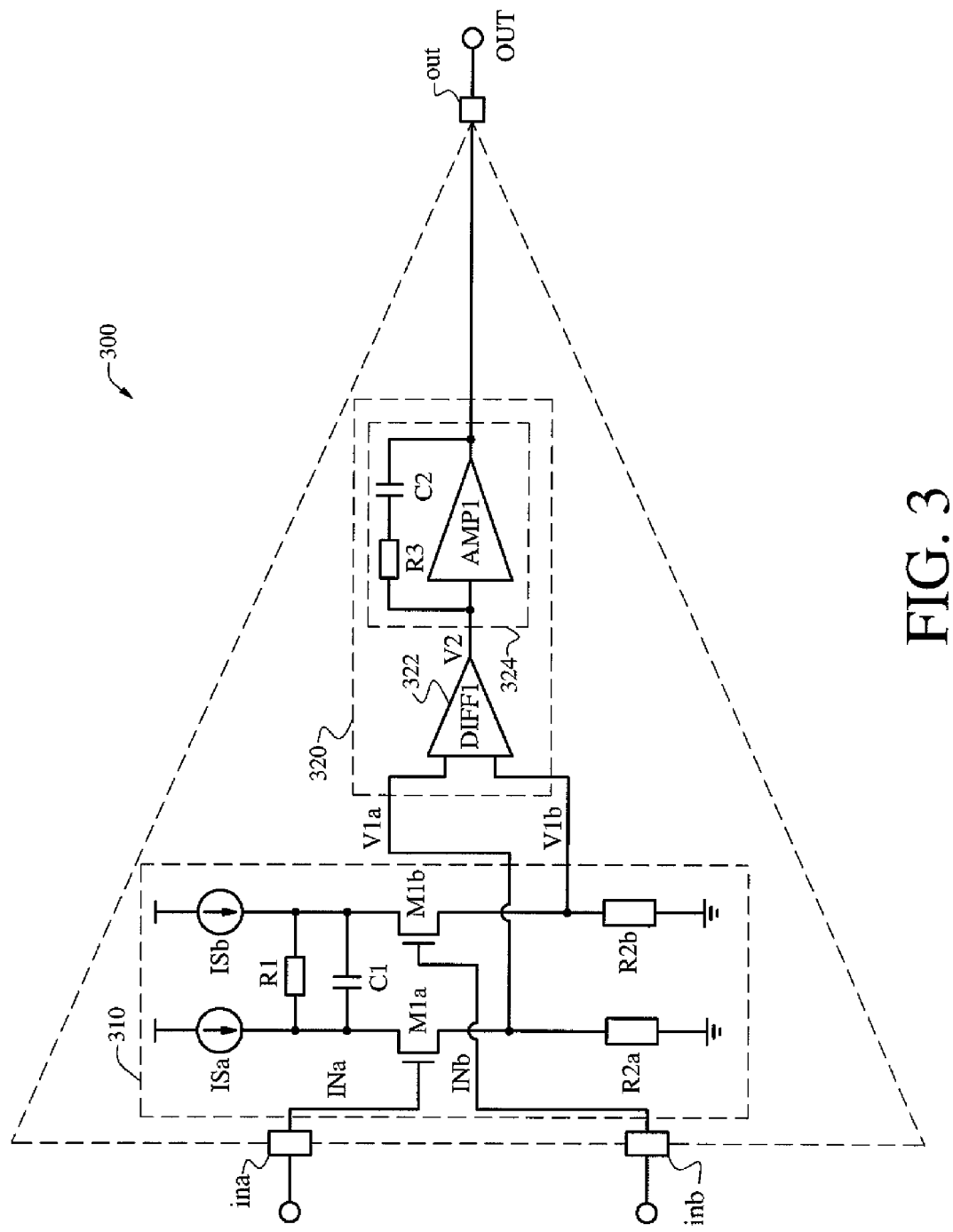
FIG. 3 is a schematic diagram of an embodiment of yet another circuit according to aspects of the present invention.

FIG. 3 is a schematic diagram of an embodiment of differential amplifier 300. Differential amplifier 300 may be employed as an embodiment of differential amplifier 100 of FIG. 1.

Preamplifier circuit 310 is arranged as a first frequency compensation circuit and as a preamplifier. In one embodiment, preamplifier circuit is arranged to provide relatively high linearity between input signals Ina, INb and output signals V1a, V1b.

Also, preamplifier circuit 310 provides a low frequency zero fz1 at a frequency that is substantially equal to:

$$\frac{1}{2*\pi*C1*R1}.$$

Preamplifier circuit 310 additionally provides a high frequency pole fp2 at a frequency that is substantially equal to:

$$\frac{gm}{2*\pi*2*C1*\left(1+\left(R2*\frac{gds}{2}\right)\right)}.$$

In these equations, R2 is equal to (R2a+R2b), gm refers to the transconductance of transistor M1a, and gds refers to the output conductance of transistor M1a. In one embodiment, transistor M1a is substantially similar to transistor M1b and resistor R2a is substantially similar to resistor R2b. In one embodiment, capacitor C1 has a value of approximately 15 picofarads and resistor R1 has a value of approximately 175 kilo-ohms. Also, capacitor C1 may be a single capacitor or multiple capacitors arranged in series and/or in parallel to provide a total equivalent capacitance. In one embodiment, capacitor C1 is a MOS capacitor which is integrated onto a monolithic integrated circuit.

Also, for example, the frequency at which pole fp2 is located may be around 600 KHz. However, other suitable values may be chosen to obtain desired the frequency response. In one embodiment, zero fz1 is provided to compensate for a complex pole that is external to differential amplifier 300. For example, the complex pole may be associated with a regulator which employs an embodiment of differential amplifier 300. In addition, capacitor C1 and resistor R1 are arranged such that low frequency zero is provided at a substantially lower frequency than the location of pole fp2. In one embodiment, this enables preamplifier circuit 310 to provide increased high-frequency gain.

In one embodiment, the transfer function of preamplifier circuit 310 is substantially equal to:

$$\frac{Vo}{Vi} = \frac{\frac{R2}{R1}*(1+S*C1*R1)}{1+S*C1*\left(\frac{\left(1+R2*\frac{gds}{2}\right)}{gm}\right)},$$

where S=2*π*f, Vo is equal to the voltage difference between signals V1a and V1b, Vi is equal the voltage difference between signals INa and INb, and f is the frequency of Vi.

Current sources ISa and ISb are arranged to provide substantially constant currents to transistors M1a and M1b, respectively. Current sources ISa and ISb may provide currents of any suitable magnitude a particular application. In one embodiment, current source ISa is substantially similar to current source ISb. In one embodiment, current sources ISa and ISb are Widlar current mirrors. In other embodiments, Cascode current sources, switching current regulators, linear current regulators, and/or the like, may be suitably employed. Current sources ISa and ISb may be buffered or unbuffered and may be regulated or unregulated.

Throughout FIG. 3, transistors M1a and M1b are described as MOSFET transistors. However, BJTs, JFETs, and/or the like, may also be suitable used with little or no circuit modifications. These other embodiments are within the spirit and scope of the invention.

Gain circuit 320 is arranged as a second frequency compensation circuit and as a gain stage for differential amplifier 300. It includes differential-to-single-ended converter 322 and gain amplifier 324.

Differential-to-single-ended converter 322 of gain circuit 320 includes differential amplifier DIFF1 and is arranged to receive voltage signals V1a and V1b and to provide single-ended voltage signal V2. In one embodiment, differential amplifier DIFF1 is an operational amplifier or an operational amplifier circuit.

Gain amplifier 324 of gain circuit 320 includes amplifier AMP1, capacitor C2, and resistor R3. Capacitor C2 and resistor R3 are arranged to provide feedback to amplifier AMP1. In one embodiment, capacitor C2 has a value of approximately 60 picofarads and resistor R3 has a value of approximately 120 kilo-ohms. Also, for example, the frequency at which pole fp0 is located may be around 100 Hz. However, other suitable values may be chosen to obtain the desired frequency response.

Gain circuit 320 provides a zero fz2 at a frequency that is substantially equal to:

$$\frac{1}{2*\pi*C2*R3},$$

and a dominate pole fp0 at a frequency that is substantially equal to:

$$\frac{1}{2*\pi*Rout(DIFF1)*\text{gain}(AMP1)*C2},$$

where Rout(DIFF1) is the output resistance of differential amplifier DIFF1 and gain(AMP1) is the open loop DC gain of amplifier AMP1. Also, gain circuit 320 provides an additional pole fp3 at a frequency that is substantially equal to:

$$\frac{1}{2*\pi*R3*Cout(DIFF1)},$$

where Cout(DIFF1) is the output capacitance of differential amplifier DIFF1.

In one embodiment, the size of capacitor C2 can be reduced while pushing dominant pole fp0 to a higher frequency and increasing the bandwidth of amplifier circuit 300. Also, a smaller value of C2 may be employed while maintaining loop stability. For example, increased loop stability may be due to the attenuation provided by resistor R1 of preamplifier circuit 310. For example, this may improve the AC loop response of differential amplifier 300 and allow for an increased slew rate. Additionally, the transient response is improved by reducing the number of pole-zero cancellations and the number of parasitic poles.

In one embodiment, gain circuit 320 has a transfer function that is substantially equal to:

$$\frac{Vo}{Vi} = \frac{\text{gain}(DIFF1)*\text{gain}(AMP1)*(1+S*C2*R3)}{1+(S*C2*\text{gain}(AMP1)*Rout(DIFF1)*}$$
$$(1+S*Cout(DIFF1)))$$

Figure 4:
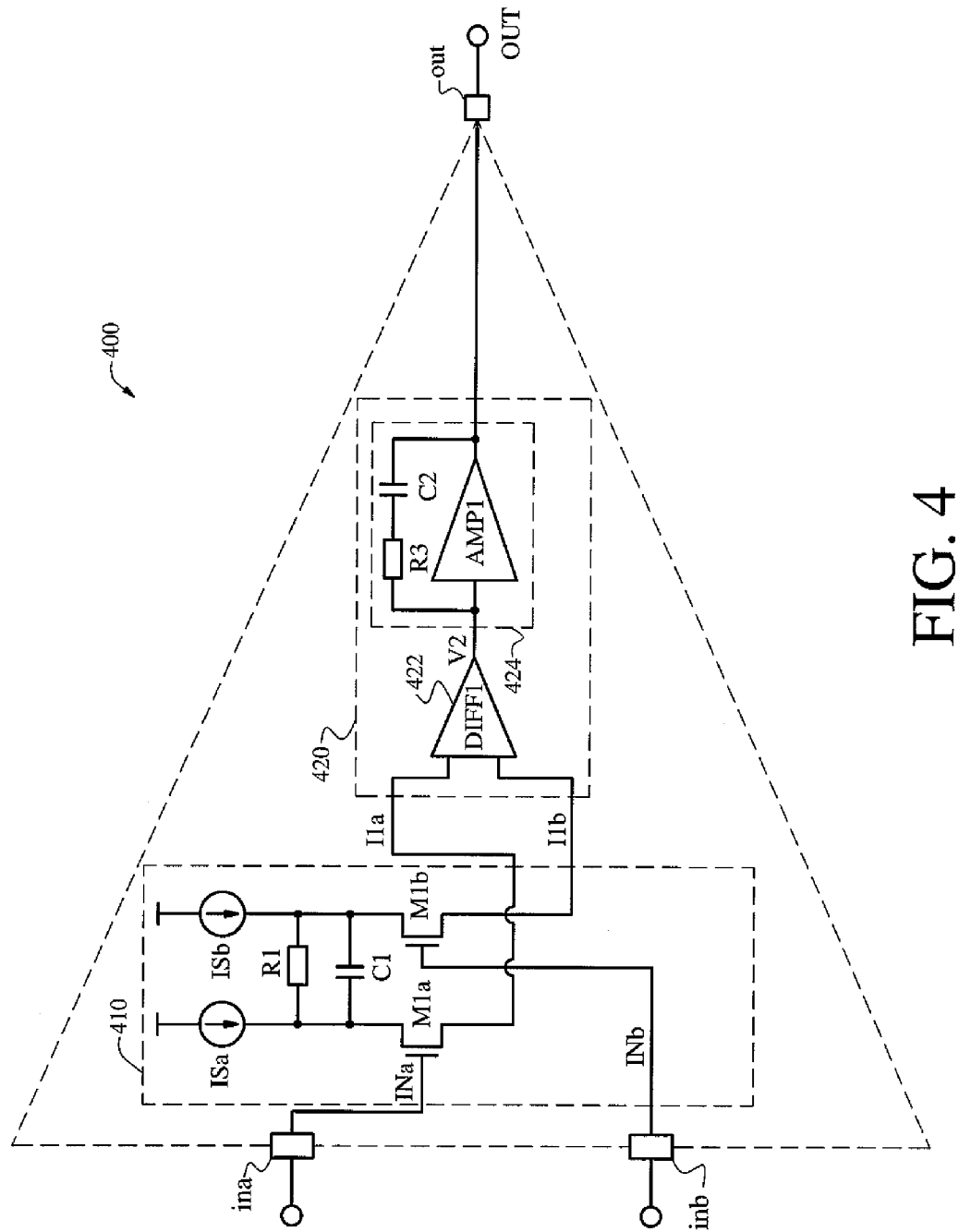
FIG. 4 is another schematic diagram of an embodiment of still yet another circuit according to aspects of the present invention.

FIG. 4 is schematic diagram of an embodiment of differential amplifier 400. Differential amplifier 400 may be employed as another embodiment of differential amplifier 100 of FIG. 1.

Preamplifier circuit 410 is arranged to provide output current signals I1a and I1b based, at least in part, on the difference between signals INa and INb. In addition, differential-to-single-ended circuit 422 is arranged to receive input current signals I1a and I1b as current inputs. In one embodiment, differential-to-single-ended circuit 422 includes MOS input loads to receive current signals I1a and I1b and are also arranged to provide output voltage signal V2 based, at least in part, on the difference between input current signals I1a and I1b.

By employing current mode signaling between preamplifier circuit 410 and differential-to-single-ended circuit 422, the effect of the parasitic loading from resistors R2a and R2b is substantially reduced. In one embodiment, this has the effect of effectively eliminating the pole which would otherwise result from the parasitic load of R2a and R2b.

Figure 5:
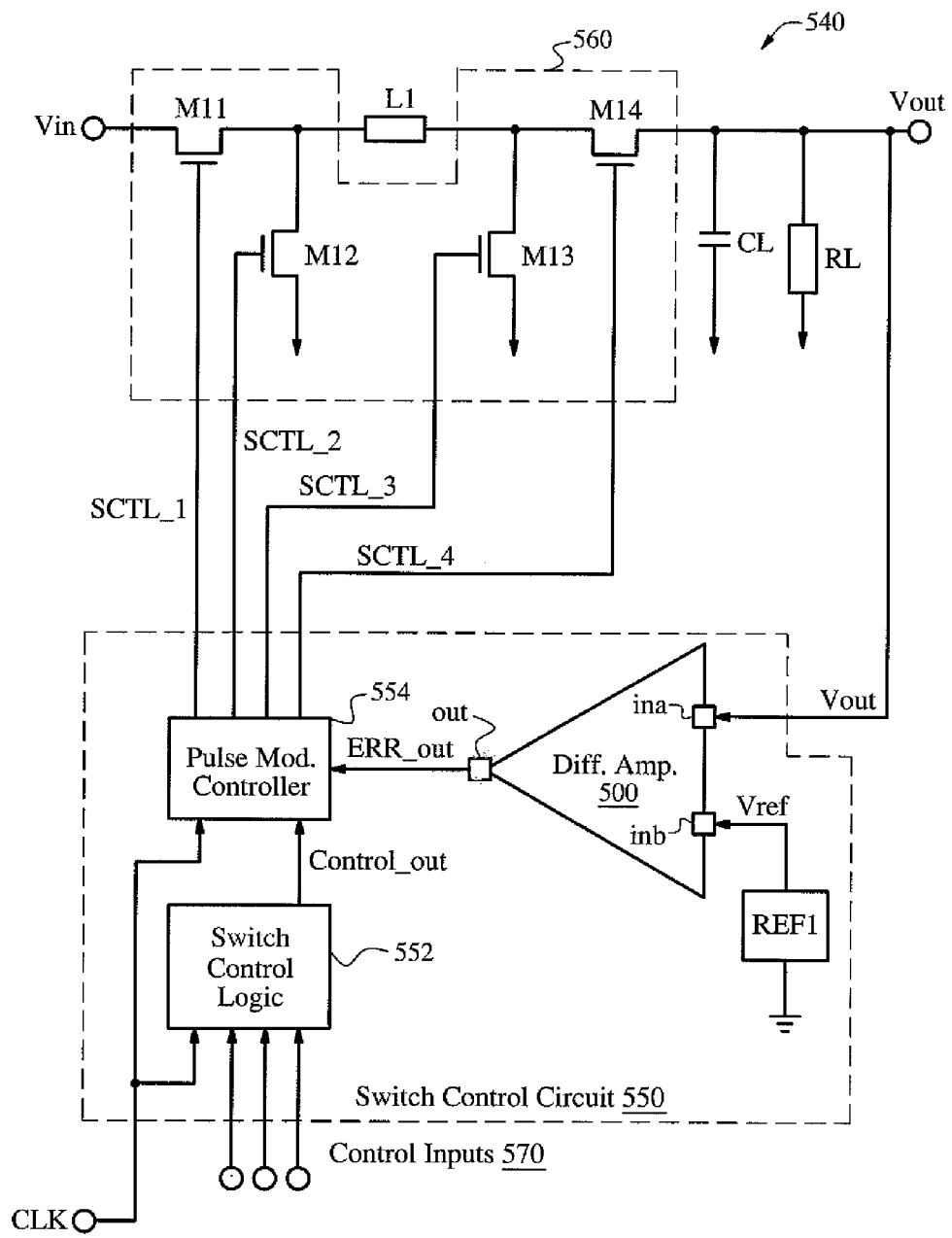
FIG. 5 is a block diagram of an embodiment of a regulator according to aspects of the present invention.

FIG. 5 is a block diagram of an embodiment of regulator 540. Regulator 540 includes switch control circuit 550 and switching circuit 560. Regulator 540 is arranged to provide regulated voltage Vout from input voltage Vin.

In the illustrated embodiment, regulator 540 is a simplified model of a voltage mode synchronously rectified switching buck-boost regulator. Embodiments of differential amplifier 500 may be employed as error amplifiers in voltage mode buck-boost or boost regulators. In these regulators, the internal compensation provided by differential amplifier 500 compensates for the regulator's complex poles. For example, the internal compensation may be designed to provide one or more zeros to effectively cancel complex poles that are associated with regulator 540. In one embodiment, a low frequency zero is provided at a frequency that is substantially below the frequency of the differential amplifier dominate pole, and this low frequency zero serves to increase the stability of regulator 500.

However, differential amplifier 500 may also be suitably employed in other regulators such as buck regulators, inverting regulators, fly-back regulators, linear regulators, and/or any type of regulator utilizing feedback. Such regulators may be voltage mode regulators, current mode regulators, synchronously rectified, asynchronously rectified, and/or the like. These and other variations are within the spirit and scope of the invention.

In one embodiment, switch control circuit 550 includes differential amplifier 500, switch control logic 552, pulse modulation controller 554, and reference source REF1. Switch control circuit 550 is arranged to monitor Vout or another output voltage relative to a reference voltage source and to modulate switch control signals SCTL_1-SCTL_4 to perform power regulation.

Differential amplifier 500 may be an embodiment of differential amplifier 100 of FIG. 1. Differential amplifier 500 is arranged to provide error signal ERR_out based on the difference between output voltage signal Vout and reference signal Vref. Reference voltage Vref is provided by reference source REF1. Reference source REF1 may be either internal or external and may provide a reference voltage of any suitable value.

In one embodiment, switch control logic 552 is arranged to receive control inputs 570 and to provide one or more control signals CONTROL_out to pulse modulation controller 554. Signal CONTROL_out may be employed to indicate an operational mode (e.g. buck, boost, PFM, PWM, startup, shutdown, etc.); to modify switching thresholds; to adjust timing; and/or the like. Control signals 570 may include clock signal CLK, various reference voltages, load current limits, load current indicators, input current limits, input current indicators, temperature limits, temperature indicators, compensation signals, mode selection signals, and/or the like.

Pulse modulation circuit 554 is arranged provide switch control signals SCTL_1-SCTL_4 to switch circuit 560 based on signals ERR_out, CONTROL_out, and/or CLK. In one embodiment, pulse modulation control circuit 554 includes a pulse width modulation (PWM) circuit. Pulse modulation control circuit 554 may also include a pulse frequency modulation (PFM) circuit.

Switching circuit 560 is arranged to selectively couple node Vin to inductor L1 and to selectively couple inductor L1 to node Vout. In one embodiment, transistors M11-M14 are N-channel MOSFET switching devices. However, in other embodiments, P-channel MOSFET devices, BJT transistors, JFET transistors, relays, and/or the like, and combinations thereof, may be suitably employed instead of transistors M11-M14. Transistors M11-M14 may be either similar or different from each other.

Inductor L1, capacitor CL, and load RL may be of any suitable types or values for use with power regulation.

In one example of buck mode operation, transistor M13 is held opened and transistor M14 is held closed. Transistor M11 is selectively closed to couple Vin to inductor L1. While transistor M11 is closed, transistor M12 is open and current flows from Vin to inductor L1 and also begins charging load capacitor CL. At some point, transistor M11 is opened and transistor M12 is closed. Current then flows from ground to inductor L1 and to load capacitor CL. This cycle repeats on a periodic basis.

In an example of boost mode current operation, transistor M12 is held opened and transistor M11 is held closed. Transistor M13 is selectively closed to couple inductor L1 to ground. While transistor M13 is closed, transistor M14 is open to isolate load capacitor CL from ground. At some point, transistor M13 is opened and transistor M14 is closed. Current then flows from inductor L1 to load capacitor CL. This cycle repeats on a periodic basis.

In some embodiments, power converter 540 may differ from the illustrated embodiment. For example, output stages of linear regulation systems may include one or more pass transistors; output stages of a PFM controlled regulation systems may include a PFM control circuit; regulator 540 may include over-voltage protection circuitry, under-voltage protection circuitry, over-current protection circuitry, under-current protection circuitry, temperature protection circuitry, or battery status monitoring circuitry; a driver circuit may be included between switch control circuit 550 and switching circuit 560; and/or the like.

Figure 6:
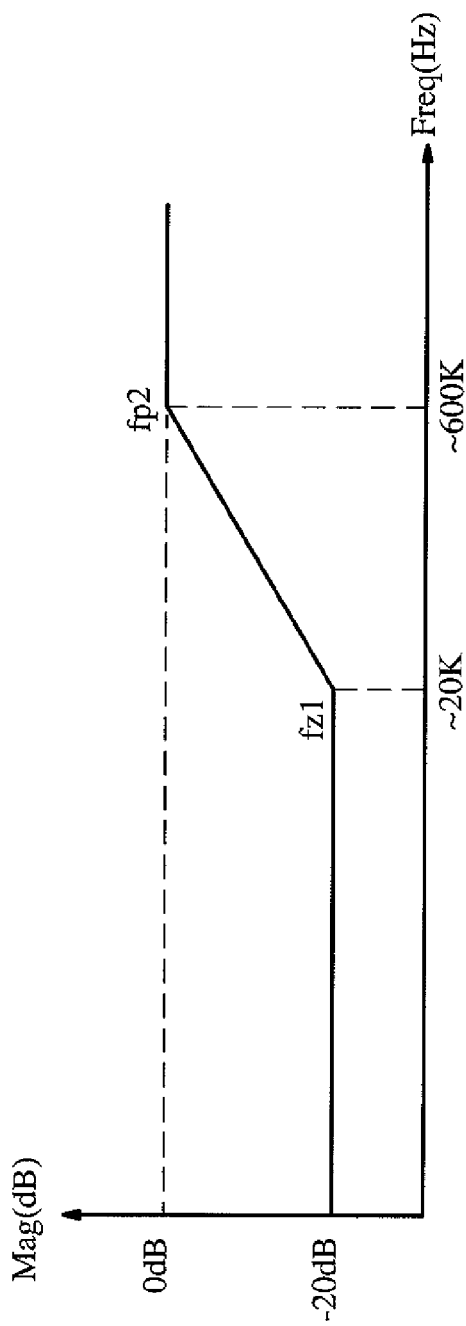
FIG. 6 is a bode plot of frequency response characteristics of an embodiment of a preamplifier circuit according to aspects of the present invention.

FIG. 6 is a bode plot of frequency response characteristics of an embodiment of a preamplifier circuit. FIG. 6 illustrates the gain of a preamplifier circuit relative to frequency. As shown in FIG. 6, one embodiment of a preamplifier circuit provides low frequency zero fz1 at approximately 20 kilohertz, and has pole fp2 at approximately 600 kilohertz. In other embodiments, the frequency response characteristics may be different. As discussed above, low frequency pole fz1 is beneficially provided at a lower frequency than pole fp2. For example, this enables embodiments of preamplifier circuits to provide increased high-frequency gain.

Figure 7:
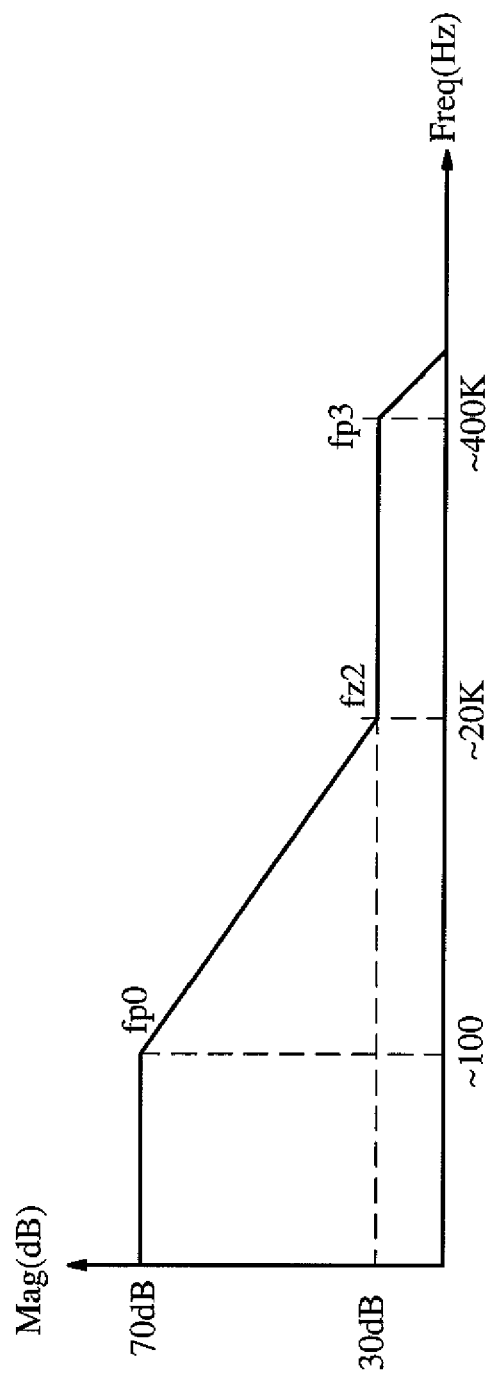
FIG. 7 is a bode plot of frequency response characteristics of an embodiment of a gain circuit according to aspects of the present invention.

FIG. 7 is a bode plot of frequency response characteristics of an embodiment of a gain circuit. FIG. 7 illustrates the gain of a gain circuit relative to frequency. As shown in FIG. 7, one embodiment of a preamplifier provides zero fz2 at approximately 20 kilohertz. In addition, poles fp0 and fp3 are at approximately 100 hertz and 400 kilohertz, respectively. In other embodiments, these frequency response characteristics may be different. In this bode plot, pole fp0 is a low frequency dominate pole that is substantially generated by a capacitor such as capacitor C2 of FIG. 3.

The above specification, examples and data provide a description of the method and applications, and use of the invention. Since many embodiments of the invention can be made without departing from the spirit and scope of the invention, this specification merely set forth some of the many possible embodiments for the invention.

What is claimed as new and desired to be protected by Letters Patent of the United States is:

1. A circuit for providing a zero, comprising:
   a differential amplifier, including:
      a preamplifier circuit, having at least a first input, a second input, a first output, and a second output, wherein the preamplifier includes:
         a first transistor that is coupled between a first transistor node and the first output of the preamplifier circuit, and that is further coupled to the first input of the preamplifier circuit;
         a second transistor that is coupled between a second transistor node and the second output of the preamplifier circuit, and that is further coupled to the second input of the preamplifier circuit; and
         a capacitor that is coupled between the first transistor node and the second transistor node; and
   a gain circuit comprising:
      a differential-to-single-ended circuit that is arranged to provide a single-ended signal based, at least in part, on a value at the first output of the preamplifier circuit and a value at the second output of the preamplifier circuit; and
      a gain amplifier circuit that is arranged to provide an amplified signal based, at least in part, on a value on the single-ended signal, and a gain factor.

2. The circuit of claim 1, wherein the preamplifier circuit further includes:
   a resistor that is coupled between the first transistor node and the second transistor node.

3. The circuit of claim 1, wherein the preamplifier circuit further includes:
   a first current source circuit that coupled to the first transistor node; and
   a second current source circuit that is coupled to the second transistor node.

4. The circuit of claim 1, wherein the preamplifier circuit and the capacitor are integrated onto a monolithic integrated circuit.

5. The circuit of claim 1, wherein the capacitor has an associated capacitance value that is less than approximately 30 picofarads.

6. The circuit of claim 1, wherein the first transistor and the second transistor are N-channel MOSFET transistors that have at least a drain, a source, and a gate, wherein the source of the first transistor is coupled to the first transistor node, the drain of the first transistor is coupled to the first output of the preamplifier circuit, the gate of the first transistor is arranged to receive the first input of the preamplifier circuit, the source of the second transistor is coupled to the second transistor node, the drain of the second transistor is coupled to the second output of the preamplifier circuit, and the gate of the second transistor is arranged to receive the second input of the preamplifier circuit.

7. The circuit of claim 1, wherein the differential-to-single-ended circuit is arranged to provide the single-ended signal based, at least in part, on a magnitude of a first current at the first output of the preamplifier circuit and a magnitude of a second current at the second output of the preamplifier circuit.

8. The circuit of claim 1, wherein the differential-to-single-ended circuit is arranged to provide the single-ended signal based, at least in part, on a magnitude of a first voltage at the first output of the preamplifier circuit and a magnitude of a second voltage at the second output of the preamplifier circuit.

9. The circuit of claim 1, wherein the gain amplifier circuit includes:
   an amplifier, having at least an input and an output;
   a resistor; and
   another capacitor, wherein the resistor is coupled between the input of the amplifier and an amplifier node, and wherein said another capacitor is coupled between the amplifier node and the output of the amplifier.

10. The circuit of claim 1, wherein the preamplifier provides a first zero at a frequency that is substantially equal to:

$$\frac{1}{2*\pi*C1*R1},$$

wherein C1 refers to a capacitance value associated with the capacitor, and R1 refers to a value of a resistance between the first transistor node and the second transistor node.

11. The circuit of claim 9, wherein the gain circuit is arranged to provide a second zero at a frequency that is substantially equal to:

$$\frac{1}{2*\pi*C2*R3},$$

wherein C2 refers to a capacitance value associated with said another capacitor, and R3 refers to a value of a resistance value associated with the resistor.

12. The circuit of claim 1, wherein the preamplifier circuit has a transfer function that is substantially equal to:

$$\frac{Vo}{Vi} = \frac{\frac{R2}{R1}*(1+S*C1*R1)}{1+S*C1*\left(\frac{\left(1+R2*\frac{gds}{2}\right)}{gm}\right)},$$

wherein C1 refers to a capacitance value associated with the capacitor, R1 refers to a value of a resistance between the first transistor node and the second transistor node R2 refers to the output resistance of the preamplifier circuit, gds refers to the output conductance of the first transistor, gm refers to the transconductance of the first transistor, and S is equal to 2*π*frequency.

13. The circuit of claim 9, wherein the differential-to-single-ended circuit and the gain amplifier circuit have a combined transfer function that is substantially equal to:

$$\frac{Vo}{Vi} = \frac{\text{gain}(DIFF1)*\text{gain}(AMP1)*(1+S*C2*R3)}{1+(S*C2*\text{gain}(AMP1)*Rout(DIFF1)*}{(1+S*Cout(DIFF1)))},$$

wherein C2 refers to a capacitance value associated with said another capacitor, and R3 refers to a value of a resistance value associated with the resistor, gain(DIFF1) refers to the open loop DC gain of differential-to-single-ended circuit, gain(AMP1) refers to the open loop DC gain of the gain amplifier circuit, Rout(DIFF1) refers to the output resistance of differential-to-single-ended circuit, Cout(DIFF1) refers to the output capacitance of differential-to-single-ended circuit, and S is equal to 2*π*frequency.

14. The circuit of claim 1, wherein the differential amplifier enables improved AC and transient power regulation performance.

15. The circuit of claim 1, further comprising:
a switch control circuit that is arranged to provide a switch control signal such that at least during a first operational mode, the switch control signal is based, in part, on the amplified signal.

16. The circuit of claim 15, wherein the switch control circuit is arranged to provide at least one of pulse-width-modulation switching, pulse-frequency-modulation switching, constant-on-time switching, or hysteric switching; and is arranged to control at least one of a buck-boost regulator or a boost regulator.

17. The circuit of claim 15, further comprising:
a switch circuit that is arranged to receive the switch control signal, and is arranged such that while the switch control signal is asserted, an input voltage node is coupled to an output voltage node.

18. A circuit for providing a zero, comprising:
a preamplifier circuit, having at least a first input, a second input, a first output and a second output, wherein the preamplifier is arranged to provide a first signal at the first output and to provide a second signal at the second output, and wherein the preamplifier circuit includes:
a first transistor that is arranged to control a first current flow between a first transistor node and the first output of the preamplifier circuit based, at least in part, on a first signal received at the first input of the preamplifier circuit;
a second transistor that is arranged to control a second current flow between a second transistor node and the second output of the preamplifier circuit based, at least in part, on a second signal received at the second input of the preamplifier circuit; and
a capacitor that is coupled between the first transistor node and the second transistor node, wherein the preamplifier circuit is arranged to provide a first zero that compensates for an external complex pole of an associated power converter; and
a gain circuit that is arranged to receive at least the first signal and the second signal, and is further arranged to provide an amplified signal based, at least in part, on values at the first signal and the second signal.

19. The circuit of claim 18, wherein the first zero is provided at a frequency that is substantially equal to:

$$\frac{1}{2*\pi*C1*R1},$$

wherein C1 refers to a capacitance value associated with the capacitor, and R1 refers to a value of a resistance between the first transistor node and the second transistor node.

20. The circuit of claim 18, wherein the gain circuit is arranged to provide a second zero at a frequency that is substantially equal to:

$$\frac{1}{2*\pi*C2*R3},$$

wherein C2 refers to a capacitance value associated with a gain circuit capacitor, and R3 refers to a value of a resistance in series with the gain circuit capacitor.

* * * * *

UNITED STATES PATENT AND TRADEMARK OFFICE
CERTIFICATE OF CORRECTION

PATENT NO. : 7,504,888 B1
APPLICATION NO. : 11/862006
DATED : March 17, 2009
INVENTOR(S) : Shu-Ing Ju et al.

It is certified that error appears in the above-identified patent and that said Letters Patent is hereby corrected as shown below:

In column 2, line 48, delete "in a" and insert -- ina --, therefor.

In column 5, line 53, delete "11a and 11b" and insert -- I1a and I1b --, therefor.

Signed and Sealed this

Twenty-fifth Day of August, 2009

David J. Kappos
*Director of the United States Patent and Trademark Office*